(12) United States Patent
El-Fahrane

(10) Patent No.: US 7,521,740 B2
(45) Date of Patent: Apr. 21, 2009

(54) SEMICONDUCTOR DEVICE COMPRISING EXTENSIONS PRODUCED FROM MATERIAL WITH A LOW MELTING POINT

(75) Inventor: Rebha El-Fahrane, Grenoble (FR)

(73) Assignee: NXP B.V., Eindhoven (NL)

( * ) Notice: Subject to any disclaimer, the term of this patent is extended or adjusted under 35 U.S.C. 154(b) by 213 days.

(21) Appl. No.: 10/554,067

(22) PCT Filed: Apr. 16, 2004

(86) PCT No.: PCT/IB2004/001254

§ 371 (c)(1),
(2), (4) Date: Oct. 21, 2005

(87) PCT Pub. No.: WO2004/095565

PCT Pub. Date: Nov. 4, 2004

(65) Prior Publication Data

US 2006/0246673 A1  Nov. 2, 2006

(30) Foreign Application Priority Data

Apr. 24, 2003  (FR) .................................. 03 50127

(51) Int. Cl.
*H01L 31/112* (2006.01)
(52) U.S. Cl. .................. 257/288; 438/303; 257/300; 257/301; 257/302

(58) Field of Classification Search .............. 257/300, 257/301, 302, 288
See application file for complete search history.

(56) References Cited

U.S. PATENT DOCUMENTS

| 5,710,450 | A  | * | 1/1998 | Chau et al. ............... 257/344 |
| 6,121,100 | A  | * | 9/2000 | Andideh et al. .......... 438/305 |
| 6,274,894 | B1 | * | 8/2001 | Wieczorek et al. ...... 257/192 |
| 6,358,806 | B1 | * | 3/2002 | Puchner .................. 438/308 |

* cited by examiner

*Primary Examiner*—N Drew Richards
*Assistant Examiner*—Swapneel Chhaya
(74) *Attorney, Agent, or Firm*—Peter Zawilski

(57) ABSTRACT

A semiconductor device comprises a gate electrode (1) and a gate insulating layer (2) both surrounded by a spacer (3) and produced on a surface (S) of a substrate (100) of a first semiconductor material. The device also comprises a source region (4) and a drain region (5) both situated below the surface of the substrate, respectively on two opposite sides of the gate electrode (1). The source region and the drain region each comprise a portion of a second semiconductor material (6, 7) disposed on the substrate (100) and extending between the substrate (100) and the spacer (3). The second material has a melting point lower than the melting point of the first material. The portions of second material (6, 7) constitute extensions of the source (4) and drain (5) regions. The semiconductor device can be an MOS transistor.

11 Claims, 4 Drawing Sheets

SEMICONDUCTOR DEVICE COMPRISING EXTENSIONS PRODUCED FROM MATERIAL WITH A LOW MELTING POINT

The present invention relates to a semiconductor device produced on the surface of a substrate, comprising extensions of a special type. It applies in particular to a field effect transistor, produced according to MOS ("Metal Oxide Semiconductor") technology.

The extensions ("tip regions" in English), also known by the term LDD ("Low Doped Drain"), are parts of the source and drain regions of an MOS transistor, situated close to the respective ends of a channel disposed between the source and the drain. They extend to a shallow depth below the surface of the substrate which carries the transistor, as far as approximately 50 nanometers. They are in general implanted during a specific step, performed with a low-energy implantation beam. They have a conduction type identical to that of the source and drain regions, with concentrations of electrical carriers which are lower than those of the source and drain regions. The tip regions allow precise control of the electrical conduction of the source and drain regions at the ends of the channel. It is then possible to obtain a high level of reproducibility of the operating characteristics of mass-produced MOS transistors.

It becomes more difficult to produce tip regions of an MOS transistor as the dimensions of the transistor decrease, that is to say the level of integration on silicon increases. In particular, the doping elements of the parts of the source and drain have a tendency to diffuse in the tip regions when a carrier activation heating is carried out, even if this heating is produced by means of a laser focused on the tip regions ("Laser Thermal Annealing" or LTA in English). The advantage afforded by the tip regions then disappears.

The document U.S. Pat. No. 5,710,450 discloses a method of forming tip regions adapted for transistors of particularly small dimensions. It describes several types of MOS transistor which comprise portions of a semiconductor material distinct from the material of the substrate and which are disposed on the substrate within the source and drain regions. These portions are used as sources of doping elements for the formation of the tip regions. These doping elements diffuse in the substrate during a specific heating in order to confer the required electrical behavior on the tip regions. The temperature during heating must be between 800° C. and 1000° C. in order to cause effective diffusion of these doping elements and thus confer on the tip regions the required concentration of electrical carriers. However, this high temperature causes locally a melting of the materials at the interface between the silicon substrate and insulating parts disposed around each transistor, known by the acronym STI (standing for "Shallow Trench Insulator") in the jargon of persons skilled in the art. It also causes a deformation of the gate electrode of the MOS transistors.

One aim of the present invention is to propose a semiconductor device of a novel type, comprising tip regions compatible with a high level of integration, and which does not have the aforementioned drawbacks.

The invention relates to a semiconductor device comprising a gate electrode and a gate insulating layer produced on part of the surface of a substrate in a first semiconductor material. The gate electrode and the gate insulating layer are surrounded, in a plane parallel to the surface of the substrate, by an insulant known as a spacer. The gate insulating layer is disposed between the substrate and the gate electrode. The device also comprises a source region and a drain region situated below the surface of the substrate, at a level of two opposite sides of the gate electrode, respectively. The source region and the drain region each contain electrical carriers of the same given type, with respect to first concentrations. They also each comprise a portion of a second semiconductor material disposed on the substrate below the level of the gate insulating layer in a direction perpendicular to the surface of the substrate. Each portion of second material extends at least partially between the substrate and the spacer, substantially as far as a limit coming into line, in said perpendicular direction, with one of the opposite sides of the gate electrode. Said portions of second material are doped with doping elements in order to create electrical carriers of said given type, with second concentrations less than said first concentrations. The portions of second material have a melting point lower than the melting point of said first material.

According to the invention, each portion of second semiconductor material at least partially fulfills a function of extension of the semiconductor device. It can be selectively melted by heating to a temperature intermediate between the melting points of the substrates and extension. Such a heating activates the electrical carriers of this portion without damaging the other elements of the device. It also makes it possible to distribute the doping elements in a substantially uniform fashion in each portion of second material.

When the heating is carried out by means of a laser, the portions of second material advantageously have an ability to absorb a light radiation greater than the absorption ability of the first material for the same light radiation.

When the first material is based on silicon, the second material can be based on germanium or based on an alloy of silicon and germanium (of the $Si_xGe_{1-x}$ type, where x is a number between 0 and 1). This is because the melting points of silicon and germanium are respectively 900° C. and 500° C. approximately.

The invention also relates to a method of manufacturing a semiconductor device of the above type.

The invention will be further described with reference to examples of embodiments shown in the drawings to which, however, the invention is not restricted.

Figure 1:
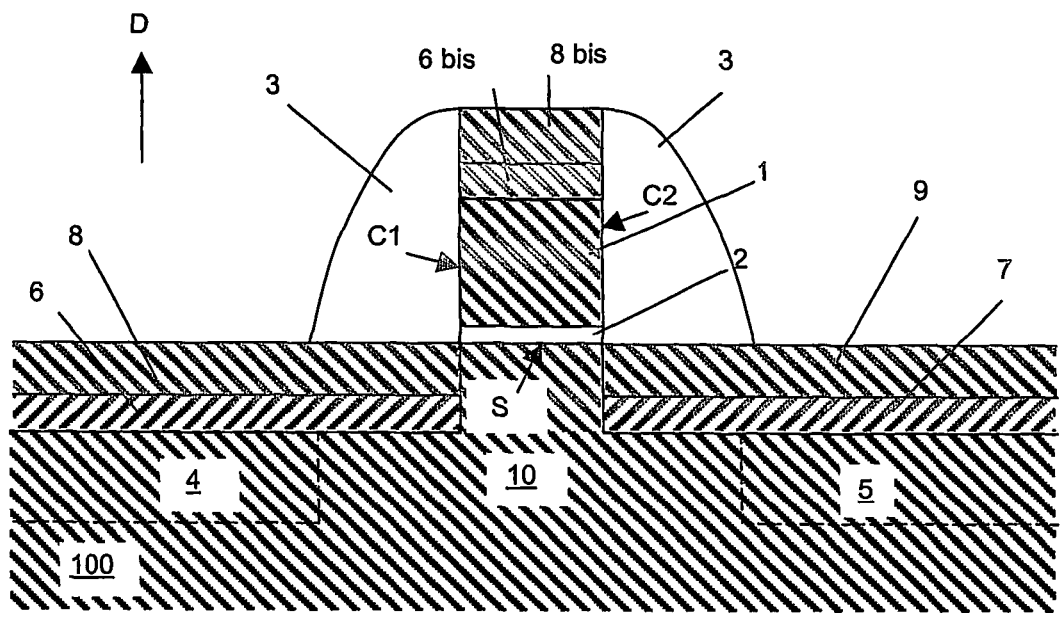
FIG. 1 is a view in section of an MOS transistor produced according to a first variant of the invention.

In these figures, for reasons of clarity, the dimensions of the various circuit parts depicted are not in proportion with actual dimensions. All these figures are views in section of a semiconductor device comprising various materials attached to a semiconductor substrate. The views in section are considered in planes perpendicular to an initial surface of the substrate. In the figures, identical references correspond to identical elements. The substrate is placed in the bottom part of each figure and D designates a direction perpendicular to the initial surface of the substrate, oriented upwards in the figures. The terms "on", "under", "above", "below", "upper" and "lower" are used hereinafter with reference to the direction D.

An MOS transistor is produced on the surface of a substrate 100 which may, for example, be made from monocrystalline silicon. In accordance with FIG. 1, it comprises a source region 4 and a drain region 5 produced by doping in the substrate 10, on each side of a conduction channel 10. The regions 4 and 5 have electrical conduction of the same type, n or p, distinct from that of the channel 10. They contain for this purpose electrical carriers with a concentration of approximately $2.10^{18}$ carriers per cubic centimeter.

Above the channel 10, a gate insulating layer 2 is disposed on the surface S of the substrate 100. A gate electrode 1 makes it possible to control the channel 10 through the layer 2. The layer 2 is made from silica ($SiO_2$), tantalum oxide ($Ta_2O_5$) or hafnium oxide ($HfO_2$), for example, and the electrode 1 is made from polysilicon for example. An insulating spacer 3, for example made from silicon nitride ($Si_3N_4$), surrounds the electrode 1 and the layer 2 parallel to the surface S.

The substrate 100 is covered, respectively above the regions 4 and 5, with two portions of a layer of germanium 6 and 7, themselves covered respectively with two portions of a layer of silicon 8 and 9. The portions 6 and 7 are situated below the level of the surface S present above the channel 10. The material of the layers 8 and 9 is, for example, conductive silicon. The portions 8 and 9 protect the portions 6 and 7 against any oxidation liable to impair the electrical properties of the latter. The portions 6-8 are extended to a limit in line with the opposite sides C1 and C2 of the electrode 1, between the spacer 3 and the substrate 100. Two supplementary portions 6bis and 8bis, respectively in the same materials as the portions 6 and 7 on the one hand and 8 and 9 on the other hand, can also be present above the electrode 1. The portions 8, 8bis and 9 can help to form metallic silicide parts for producing electrical contacts on respectively the region 4, the electrode 1 and the region 5.

The portions 6 and 7 are doped so as to create, within these portions, n or p electrical carriers, of the same type as those in the regions 4 and 5. The concentration of these electrical carriers in the portions 6 and 7 is for example around $5.10^{17}$ carriers per cubic centimeter. The portions 6 and 7 then constitute tip regions of the MOS transistor.

A method of manufacturing the above MOS transistor is now described. The elementary steps of the process carried out according to methods known to persons skilled in the art are not disclosed in detail. Only indications are given concerning the combination of these elementary steps in a given chronological order of execution, which characterizes the invention.

The silicon substrate 100 initially comprises a doping well, of the n or p type, depending on the type of transistor envisaged. In accordance with FIG. 2, the layer 2 is formed on a part P1 of the surface S of the substrate 100. The electrode 1 is next formed above the layer 2, and the spacer 3 is disposed around the layer 2 and electrode 1, parallel to the surface S, according to one of the methods normally used for manufacturing MOS transistors.

Two surface films of the material of the substrate 100 are then removed (FIG. 3) respectively in two lateral parts P2 and P3 of the surface of the substrate, situated on two opposite sides of the part P1. Each part P2 or P3 extends between the substrate 100 and the spacer 3, substantially as far as a limit coming in line, with the direction D, with one of the sides C1 or C2 of the electrode 2. The two films are removed, for example, by selective dissolving of the material of the substrate 100 in a solution containing chemical reagents selected so as to form soluble compounds with the atoms of the substrate. When the electrode 1 is in the same material as the substrate 100, an upper part P4 of the electrode 1 can be removed simultaneously.

The source 4 and drain 5 regions, situated below the surface S of the substrate 100, at a level of two lateral parts P2 and P3, respectively, are formed. The regions 4 and 5 are formed by ion implantation, in a way which is referred to as "autoaligned" with respect to the sides C1 and C2 of the spacer 3. Molecules of diborane $B_2H_4$ or phosphine $PH_3$ can be used for the implantation of the regions 4 and 5, in order to form a p or n type MOS transistor, respectively. The regions 4 and 5 then each contain electrical carriers of the same given type, for example with the concentration cited above in relation to FIG. 1.

Possibly the regions 4 and 5 may be implanted before the removal of the surface films in the lateral parts P2 and P3.

On the substrate 100, in each lateral part P2 and P3, a portion 6 or respectively 7 of a semiconductor extension material distinct from the material of the substrate 100 is formed. This extension material possesses a melting point lower than the melting point of the material of the substrate 100. When the substrate 100 is made from silicon, the extension material is for example germanium. Each portion 6 or 7 is extended substantially as far as a location coming in line, in the direction D1, with the side C1 or C2 of the electrode 1 corresponding to said lateral part. The portions 6 and 7 contain doping elements, such as atoms of boron or phosphorus, so as to create electrical carriers of the same given type as the regions 4 and 5. The doping elements of the portions 6 and 7 can be present initially in the extension material when it is formed, or be added subsequently during a step of implantation of the extension material.

The portions 6 and 7 are formed, for example, using a chemical vapor deposition (CVD) process, using organometallic precursors containing atoms of the extension material. A continuous layer of the extension material is then obtained, which covers the whole of the substrate 100, the spacer 3 and the electrode 1. By combining masking and etching, parts of this layer are removed so as to leave only the portions 6, 6bis and 7.

The portions 6 and 7 are next heated to a temperature intermediate between the respective melting points of the material of the substrate 100 and the extension material. A laser beam can be used for this heating, which makes it possible to heat regions of the transistor comprising the portions 6 and 7 respectively. In this case, the extension material is advantageously chosen so that it has an ability to absorb the laser beam greater than the ability of the material of the substrate 100 to absorb the laser beam. The portions 6 and 7 are thus melted. Once cooled, they contain electrical carriers at a substantially uniform concentration, and less than the concentration of electrical carriers in the regions 4 and 5. This heating of the portions 6 and 7 may possibly serve simultaneously as a heating activation for the electrical carriers in the regions 4 and 5.

Finally, the encapsulation portions 8 and 9 are deposited respectively on top of the portions 6 and 7. The material of the portions 8 and 9 is for example silicon. A process similar to that of the formation of the portions 6 and 7 can be used, adapted to the encapsulation material used. An encapsulation portion 8bis can possibly be formed simultaneously above the portion 6bis.

Figure 2:
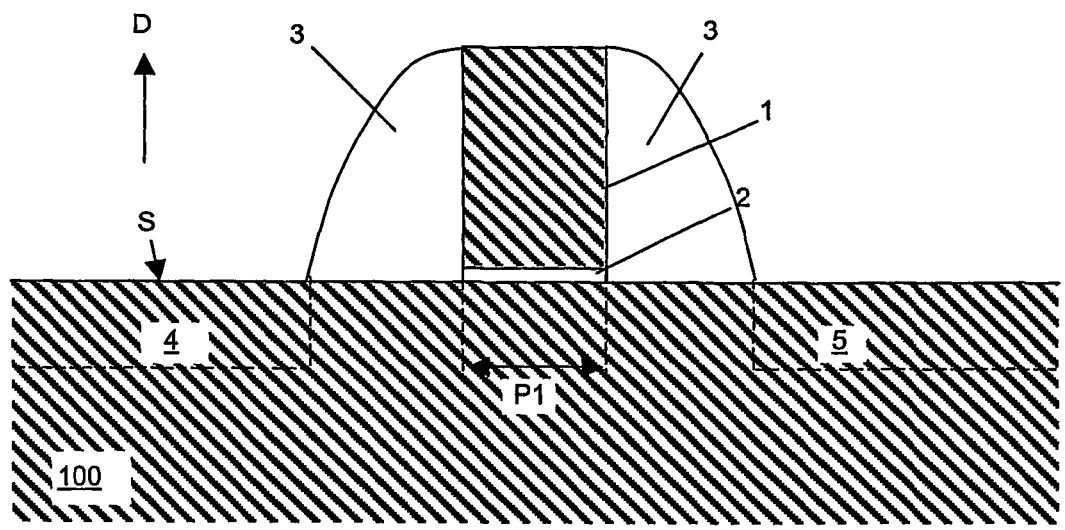
FIGS. 2 and 3 illustrate two steps of manufacturing an MOS transistor according to FIG. 1.
Figure 3:
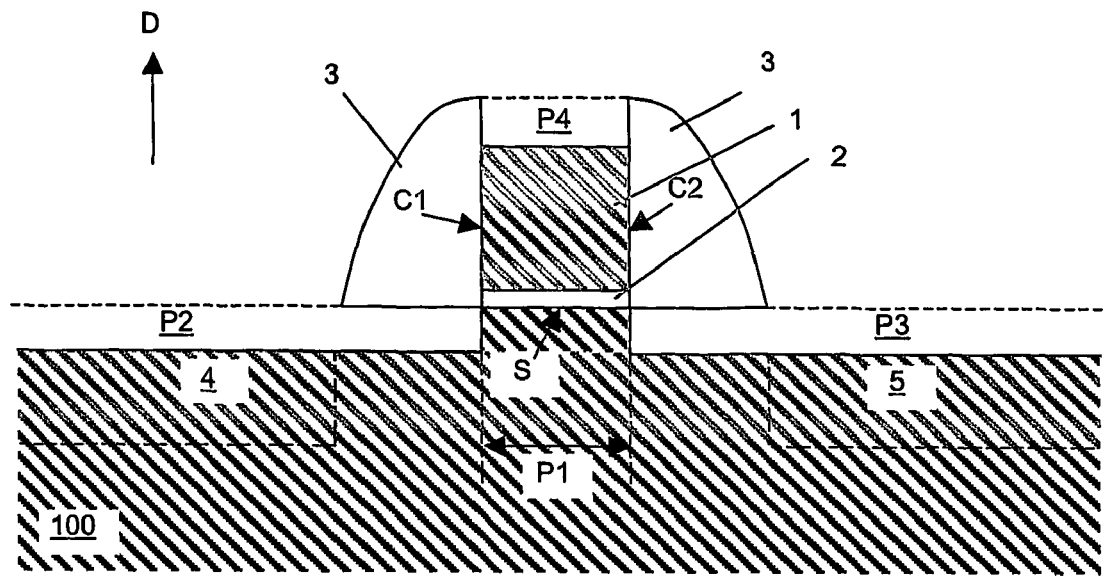

According to a first variant of the manufacturing method (FIG. 1), corresponding to FIGS. 1 to 3, the portions 6 and 7 are formed so that a free interstice remains between the upper surface of each portion 6, 7 and the lower surface of the spacer 3 on the same side of the electrode 1. The encapsulation portions 8, 9 are then deposited so that each encapsulation portion 8, 9 extends in the interstice between the spacer 3 and the portion 6 or 7 above which it is deposited. It extends substantially as far as a limit situated in line, in the direction D, with the side C1 or C2 of the electrode 1 corresponding to the encapsulation portion in question.

Figure 4:
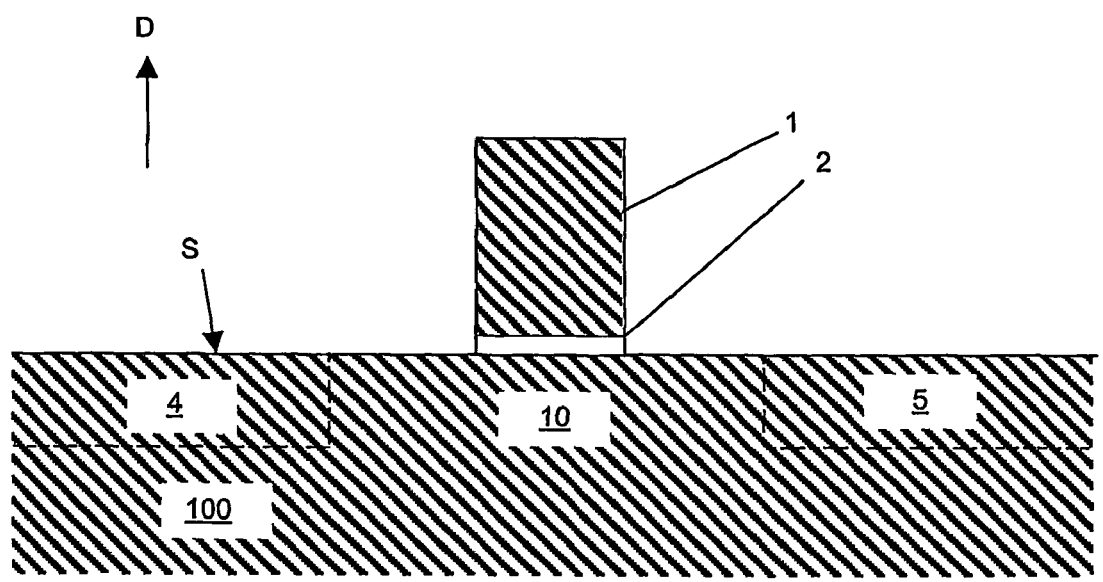
FIGS. 4-7 illustrate steps of manufacturing an MOS transistor according to a second variant of the invention.
Figure 5:
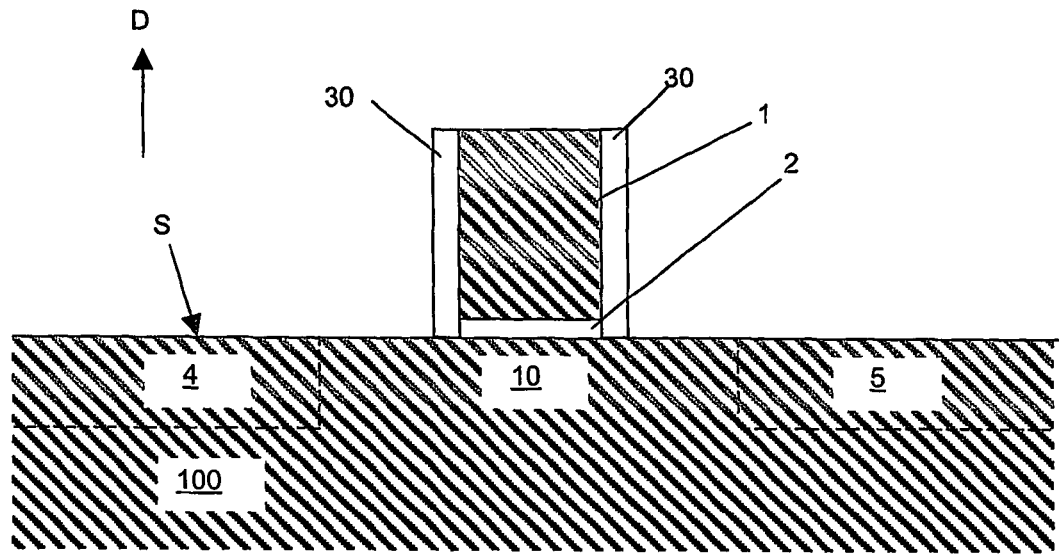
Figure 6:
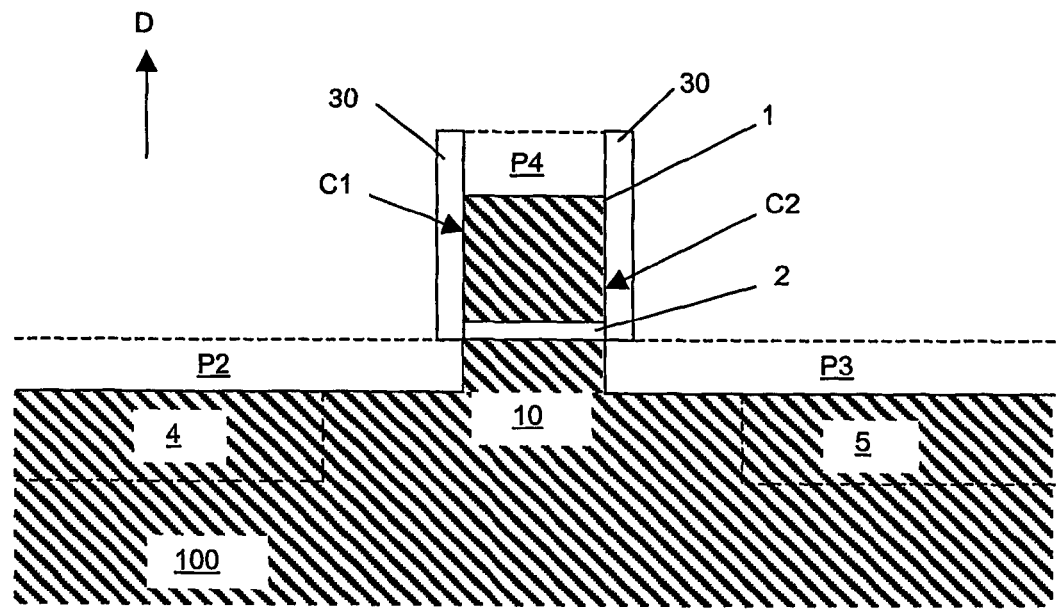
Figure 7:
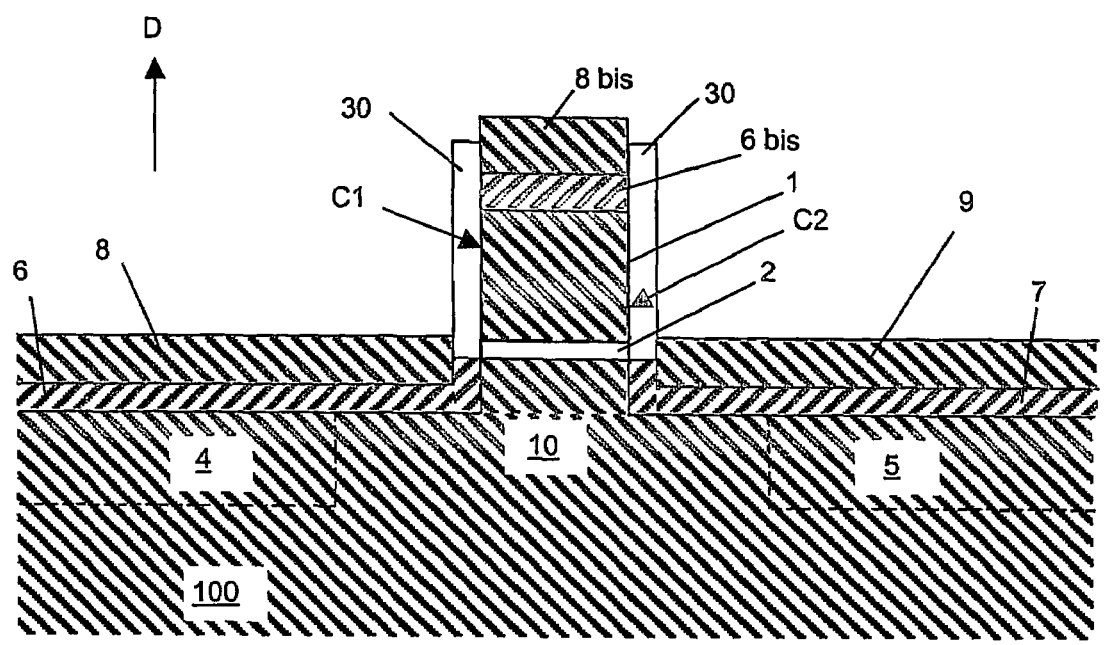

FIGS. 4-6 correspond to a second variant of the invention. Starting from the configuration in FIG. 2, the spacer 3 is removed selectively, for example by dissolving of the material of the spacer 3 in a solution comprising specially selected chemical reagents. The configuration of the transistor depicted in FIG. 4 is then obtained. After its removal, the function of the spacer 3 is to limit the implantation of the regions 4 and 5 at a distance from each side of the layer 2.

A fine layer 30 of a protective material is then deposited isotropically, for example silicon nitride ($Si_3N_4$), on the substrate 100, on the ends of the layer 2 and on the uncovered sides C1 and C2 and the top face of the electrode 1. The layer 30 has a thickness of 10 nanometers for example. In the remainder of the method of producing the transistor, the layer 30 can effect a separation between electrical contacts taken on the region 4 and on the electrode 1 and, in the same way, between electrical contacts taken on the region 3 and on the electrode 1. For this reason, and because it is situated in place of the spacer 3, the layer 30 is also called a spacer.

The layer 30 is next exposed, through its upper surface, to a directional etching plasma whose direction of bombardment is parallel to the direction D. The layer 9 is thus eliminated in its parts oriented perpendicular to the direction D. The configuration of the transistor according to FIG. 5 is thus obtained.

Surface films of the material of the substrate 10 are then removed in the parts P2 and P3, in the same way as before. According to the configuration of the transistor depicted in FIG. 6, the thickness of the films removed, in the direction D, is greater than the thickness of the layer 30, measured parallel to the surface S.

Portions of extension material 6 and 7, formed as described above, then comprise, in addition to parts of layers parallel to the surface S, edges parallel to the direction D which cover the material of the substrate 100 under the layer 30.

The method of manufacturing the MOS transistor is then continued as described above. A doping implantation of the portions 6 and 7 is carried out if these do not intrinsically comprise sufficient quantities of electrical carriers. Then the portions 6 and 7 are heated to a temperature greater than the melting point of the extension material. Encapsulation portions 8 and 9 can then be disposed on the portions 6 and 7.

According to an improvement of the first and second variants of the invention described above, portions of a fine layer of a silicon and germanium alloy is deposited in the lateral parts P2 and P3. This deposition is made between the removal of the surface films of material of the substrate 100 and the formation of the portions 6 and 7. Such portions of an alloy having a chemical composition intermediate between the respective compositions of the materials of the substrate 100 and the portions 6 and 7 reduces the interface stresses between these materials. They in particular facilitate the growth of the extension material under conditions of heteroepitaxy.

The invention has been described in the context of the production of an MOS transistor. It can be applied likewise to any semiconductor device comprising a surface junction, referred to as USJ (standing for "Ultra Shallow Junction" in English), which requires the use of an extension.

No reference sign between parentheses in the present text should be interpreted limitingly. The verb "comprise" and its conjugations must also be interpreted broadly, that is to say as not excluding the presence not only of elements or steps other than those listed after said verb but also a plurality of elements or steps already listed after said verb and preceded by the word "a" or "an".

The invention claimed is:

1. A semiconductor device comprising:
    a gate electrode and a gate insulating layer produced on a part of the surface of a substrate of a first semiconductor material having a given melting point, and surrounded by an insulating spacer in a plane parallel to the surface of the substrate, the gate insulating layer being disposed between the substrate and the gate electrode, and a source region and a drain region situated under the surface of the substrate at the level of two opposite sides of the gate electrode, respectively, each region containing electrical carriers of the same given type, with respective first concentrations, and each region comprising a portion of a second semiconductor material disposed on the substrate below the level of the gate insulating layer in a direction perpendicular to the surface of the substrate, each portion of second material extending at least partially between the substrate and the spacer, under at least a portion of the spacer and substantially as far as a limit coming in line, in said perpendicular direction, with one side of the gate electrode, said portions of second material being doped with doping elements in order to create electrical carriers of said given type with second concentrations less than said first concentrations, and said portions of second material having a melting point lower than the melting point of the first material.

2. A device as claimed in claim 1, in which said portions of second material have an ability to absorb a light radiation greater than the absorption ability of the first material for the same light radiation.

3. A device as claimed in claim 1, in which the first material is based on silicon and the second material is based on germanium or based on an alloy of silicon and germanium.

4. A device as claimed in claim 1, also comprising two encapsulation portions of said second material, disposed respectively over the portions of second material, on a side opposite to the substrate.

5. A device as claimed in claim 4, in which each encapsulation portion extends between the spacer and the portion of second material above which said encapsulation portion is disposed, substantially as far as a limit situated in line, in said direction perpendicular to the surface of the substrate, with the side of the gate electrode corresponding to said second encapsulation portion.

6. A device as claimed in claim 1, characterized in that said device is an MOS transistor.

7. A method of manufacturing a semiconductor device, comprising the following steps:
    a) a gate insulating layer is formed on a part of a surface of a substrate of a first semiconductor material having a given melting point;
    b) a gate electrode is formed on top of the gate insulating layer;
    c) an insulating spacer is formed, disposed around the gate insulating layer and the gate electrode, parallel to the surface of the substrate;
    d) two surface films of the first material are removed respectively in two lateral parts of the surface of the substrate situated on two opposite sides of the surface part of the substrate carrying the gate insulating layer and the gate electrode, each lateral part extending between the substrate and the spacer substantially as far as a limit coming in line with one of the opposite sides of the gate electrode, in a direction perpendicular to the surface of the substrate;
    e) a source region and a drain region are formed, each region being situated below the surface of the substrate at a level of said two lateral parts of the surface of the substrate, respectively, each region containing electrical carriers of the same given type with respective first concentrations;
    f) there is formed on the substrate, in each lateral part, a portion of a second semiconductor material under at least a portion of the spacer and substantially as far as a limit coming in line, in said perpendicular direction, with the opposite side of the gate electrode corresponding to said lateral part, said portions of second material containing doping elements in order to create electrical carriers of the given type, and having a melting point lower than the melting point of the first material;

g) the portions of second material are heated to a temperature intermediate between the respective melting points of the first and second materials, so that the portions of second material contain electrical carriers with second concentrations lower than said first concentrations.

8. A method as claimed in claim 7, according to which, during step g), said portions of second material are heated using a laser beam.

9. A method as claimed in claim 7, according to which, after step f), encapsulation portions are deposited respectively on top of said portions of second material, on a side opposite to the substrate.

10. A method as claimed in claim 7, according to which step e) is performed before step d).

11. A method as claimed in claim 7, wherein steps a) through g) are performed successively.

* * * * *